United States Patent
Anglin et al.

(10) Patent No.: US 10,002,764 B1
(45) Date of Patent: Jun. 19, 2018

(54) SPUTTER ETCH MATERIAL SELECTIVITY (71) Applicant: Varian Semiconductor Equipment Associates, Inc., Gloucester, MA (US)

(72) Inventors: Kevin Anglin, Somerville, MA (US); Tristan Ma, Lexington, MA (US); Morgan D. Evans, Manchester, MA (US); John Hautala, Beverly, MA (US); Heyun Yin, Saugus, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days. days.

(21) Appl. No.: 15/381,593

(22) Filed: Dec. 16, 2016

(51) Int. Cl.
*H01L 21/263* (2006.01)
*H01L 21/66* (2006.01)
*H01J 37/32* (2006.01)

(52) U.S. Cl.
CPC .... *H01L 21/2633* (2013.01); *H01J 37/32009* (2013.01); *H01J 37/32935* (2013.01); *H01L 22/12* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 3,271,286 A | 9/1966 | Lepselter | |
| 3,436,327 A | 4/1969 | Shockey | |
| 3,676,317 A | 7/1972 | Harkins, Jr. et al. | |
| 3,943,047 A | 3/1976 | Cruzan et al. | |
| RE29,947 E | 3/1979 | Ommeren | |
| 2013/0196509 A1* | 8/2013 | Tabat | C23F 4/00 438/709 |

OTHER PUBLICATIONS

Sigmund, Peter, Theory of Sputtering,I,Sputtering Yield of Amorphous and Polycrystalline Targets, Physical Review, 1969, pp. 383-416, vol. 184, No. 2.
Bohdansky, J. A Universal Relation for the Sputtering Yield of Monoatomic Solids at Normal Ion Incidence, Max-Planck-Institut fur Plasmaphysik Eurotom Association, p. 127-129, D-8046 Garchching/Munchen/FDR.
Eckstein, W., Threshold Energy for Sputtering and its Dependence on Angle of Incidence, Nuclear Instruments and Methods in Physical Research, 1993, p. 95-109. B 83.

* cited by examiner

*Primary Examiner* — Asok K Sarkar
(74) *Attorney, Agent, or Firm* — Nields, Lemack & Frame, LLC (57) ABSTRACT

A method of etching a workpiece comprising two or more materials is disclosed. The method involves using physical sputtering as the etching method where the processing parameters of the sputtering process are tuned to achieve a desired etch rate selectivity. The method includes determining the etch rate of each material disposed on the workpiece as a function of various processing parameters, such as ion species, ion energy, incidence angle and temperature. Once the relationship between etch rate and these parameters is determined for each material, a set of values for these processing parameters may be chosen to achieve the desired etch rate selectivity.

19 Claims, 10 Drawing Sheets

SPUTTER ETCH MATERIAL SELECTIVITY

FIELD

Embodiments of the present disclosure relate to modifying and controlling the sputter etch rate of a workpiece, and more particularly to controlling the selectivity of the etch rate for two or more materials disposed on the workpiece.

BACKGROUND

Fabrication of advanced three-dimensional semiconductor structures with complex surface topology and high packing density presents many technical challenges. In certain embodiments, it is desirable to planarize the surface of a workpiece, to make the top surface as flat as possible. In other embodiments, it is desirable to raise or recess certain portions of the workpiece with respect to the rest of the workpiece.

These planarization processes are most typically conducted using one of two techniques.

The first technique, known as chemical mechanical planarization (CMP), applies a chemical slurry to the workpiece and uses a polishing pad to remove material to flatten the top surface of the workpiece. However, CMP has some known drawbacks. For example, CMP is optimized for a particular width of metal on a workpiece. If there are different metal widths, the planarization across these different widths may not be uniform. Additionally, when planarizing workpieces having metal and dielectric materials on the top surface, a phenomenon known as dishing may occur. When planarizing, the metal may be more readily removed than the dielectric material. Thus, as the process continues, more metal is removed than dielectric material. Further, the metal at the midpoint of the trace is processed more than the metal at the interface with the dielectric material. This causes the top surfaces of the metal widths to form concave shapes, or dishes. Thus, CMP is sensitive to feature width and the types of material that are disposed on the workpiece.

The second technique, know as reactive ion etching (RIE), uses ions from a plasma to etch the workpiece. The workpiece is biased to attract ions from the plasma. These ions chemically react with the workpiece and also cause some sputtering due to their velocity at impact. However, RIE has been demonstrated to suffer from some issues of uniformity, such as center to edge uniformity. Further, RIE is an inherently chemical process, and may have issues of repeatability.

Therefore, it would be beneficial if there would a method of removing material from a workpiece, which could be tuned based on the type and amount of material to be removed. It would be advantageous if the method could be used not only to planarize a workpiece, but also to create recesses and structures as desired. Further, it would also be beneficial if the method was highly repeatable.

SUMMARY

A method of etching a workpiece comprising two or more materials is disclosed. The method involves using physical sputtering as the etching method where the processing parameters of the sputtering process are tuned to achieve a desired etch rate selectivity. The method includes determining the etch rate of each material disposed on the workpiece as a function of various processing parameters, such as ion species, ion energy, incidence angle and temperature. Once the relationship between etch rate and these processing parameters is determined for each material, a set of values for these processing parameters may be chosen to achieve the desired etch rate selectivity.

According to one embodiment, method of selectively etching a workpiece having two materials using a sputtering process is disclosed. The method comprises determining a first etch rate of a first material as a function of at least one processing parameter, wherein the at least one processing parameter is selected from the group consisting of ion species, ion energy, incidence angle and temperature; determining a second etch rate of a second material as a function of the at least one processing parameter; calculating etch rate selectivity of the first material to the second material based on the first etch rate and the second etch rate; selecting values of the at least one processing parameter such that the etch rate selectivity matches a desired etch rate selectivity; and sputtering the workpiece using the values of the at least one processing parameter. In certain embodiments, the first etch rate and the second etch rate are determined as a function of at least two processing parameters. Optionally, these two processing parameters may be ion energy and incidence angle. In certain embodiments, the first etch rate and the second etch rate are determined as a function of three or four processing parameters.

According to another embodiment, a method of planarizing a workpiece having a first material and a second material using a physical sputtering process is disclosed. The method comprises determining an amount that the first material protrudes beyond the second material; selecting a desired etch rate selectivity greater than 1, so as to preferentially etch the first material; determining values of processing parameters to achieve the desired etch rate selectivity, where the processing parameters are selected from the group consisting of ion species, ion energy, incidence angle and temperature; and performing the physical sputtering process using the values of the processing parameters until a surface of the workpiece is planar. In certain embodiments, the desired etch rate selectivity is determined by determining a first etch rate of the first material as a function of at least one of the processing parameters; determining a second etch rate of the second material as a function of the at least one of the processing parameters; calculating a maximum etch rate selectivity based on the first etch rate and the second etch rate; and using the maximum etch rate selectivity as the desired etch rate selectivity. In certain embodiments, the method further comprises selecting a desired depth at which a surface of the workpiece is to be planar; measuring a first distance from a top of the first material to the desired depth; measuring a second distance from a top of the second material to the desired depth; and calculating the desired etch rate selectivity by dividing the first distance by the second distance. In certain embodiments, this method is used as part of a selective area process, to planarize a portion of a surface of a workpiece.

According to another embodiment, a method of processing a workpiece comprising a first material and a second material is disclosed. The method comprises physically sputtering the workpiece using ions of an ion species directed toward the workpiece at a predetermined incidence angle and energy, where the ion species, the predetermined incidence angle and energy are selected to achieve a desired etch rate selectivity, where etch rate selectivity is defined as a ratio of an etch rate of the first material to an etch rate of the second material, and the ion species is an inert gas. In certain embodiments, the first material is a metal. In certain embodiments, the first material forms a three-dimensional structure and the second material is disposed on sidewalls of the three-dimensional structure. In certain embodiments, the first material is disposed in parallel strips along a surface of the workpiece and the second material is disposed between the parallel strips, and the ions are directed toward the workpiece at a non-zero incidence angle and the ions are parallel to a major axis of the parallel strips. In some embodiments, temperature is also selected to achieve the desired etch rate selectivity.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
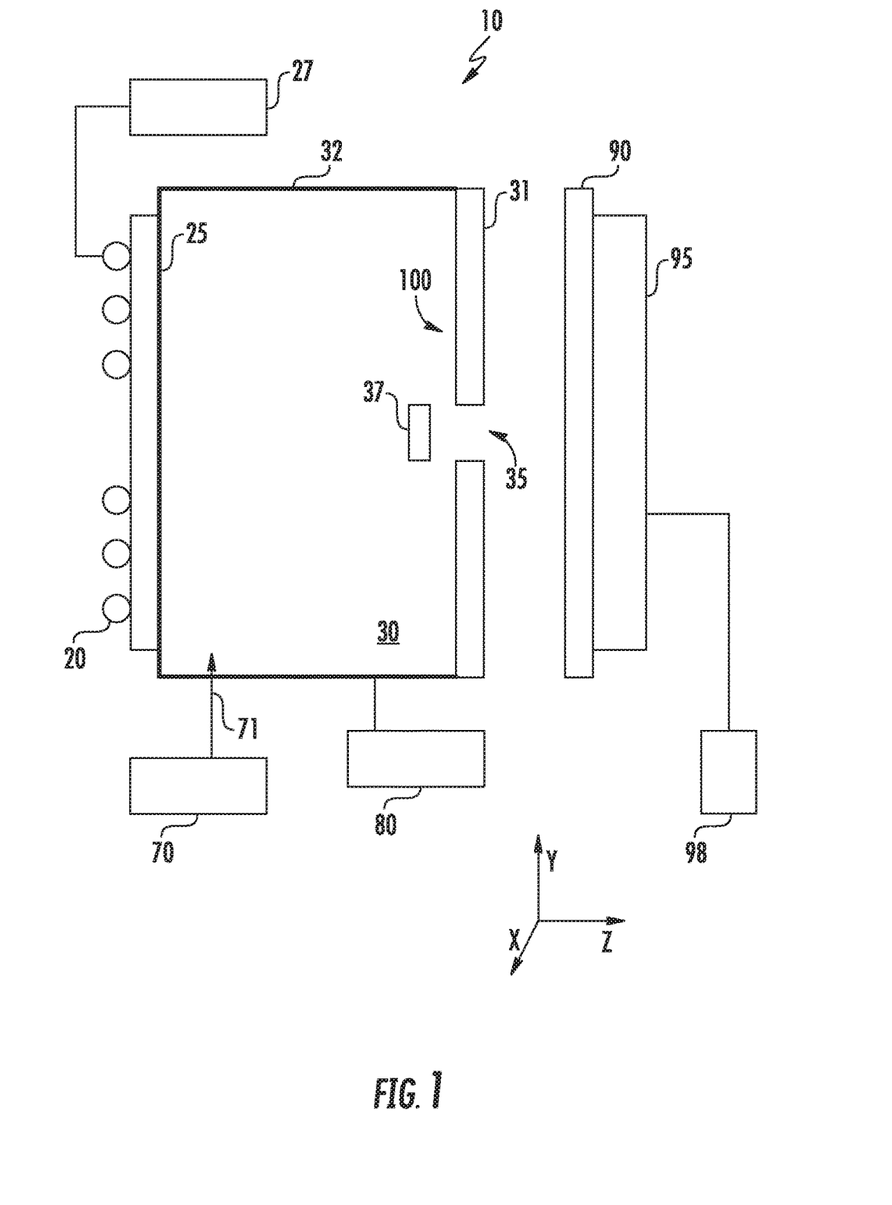
FIG. 1 is a workpiece processing apparatus that may be utilized in accordance with one embodiment.

FIG. 1 shows a first embodiment of workpiece processing apparatus 10 that may be used to perform the methods described herein. The workpiece processing apparatus 10 comprises a plasma chamber 30, which is defined by a plurality of chamber walls 32.

An antenna 20 is disposed external to a plasma chamber 30, proximate a dielectric window 25. The dielectric window 25 may also form one of the walls that define the plasma chamber 30. The antenna 20 is electrically connected to a RF power supply 27, which supplies an alternating voltage to the antenna 20. The voltage may be at a frequency of, for example, 2 MHz or more. While the dielectric window 25 and antenna 20 are shown on one side of the plasma chamber 30, other embodiments are also possible. For example, the antenna 20 may surround the chamber walls 32 or be disposed on the top of the plasma chamber 30. The chamber walls 32 of the plasma chamber 30 may be made of a conductive material, such as graphite. These chamber walls 32 may be biased at an extraction voltage, such as by extraction power supply 80. The extraction voltage may be, for example, 1 kV, although other voltages are within the scope of the disclosure.

The workpiece processing apparatus 10 includes an extraction plate 31 having an extraction aperture 35. The extraction plate 31 may form another wall that defines plasma chamber 30. The extraction aperture 35 may be about 320 mm in the x-direction and 30 mm in the y-direction, although other dimensions are possible. The extraction plate 31 may have a thickness in the z-direction of between 5 and 10 mm, although other dimensions are also possible. This extraction plate 31 may be disposed on the side of the plasma chamber 30 opposite the dielectric window 25, although other configurations are also possible. In certain embodiments, the extraction plate 31 may be constructed from an insulating material. For example, the extraction plate 31 may comprise quartz, sapphire, alumina or a similar insulating material. The use of an insulating material may allow modulation of the plasma sheath, which affects the angle at which charged ions exit the extraction aperture 35. In other embodiments, the extraction plate 31 may be constructed of a conducting material.

A blocker 37 may be disposed proximate the extraction aperture 35 on the interior of the plasma chamber 30. In certain embodiments, the blocker 37 is constructed from an insulating material. The blocker 37 may be about 3-5 mm in the z-direction, and the same dimension as the extraction aperture 35 in the x-direction. The length of the blocker 37 in the y-dimension may be varied to achieve the target extraction angles.

The position and size of the blocker 37 along with the size and shape of the edges of the extraction aperture 35 define the boundary of the plasma sheath within the plasma chamber 30. The boundary of the plasma sheath, in turn, determines the angle at which charged ions cross the plasma sheath and exit through the extraction aperture 35. In certain embodiments, the blocker 37 may include a conductive material. In these embodiments, the conductive material on the blocker 37 may be biased so as to create an electric field proximate the extraction aperture 35. The electric field may also serve to control the angle at which the charged ions exit through the extraction aperture 35. A blocker 37 positioned between the interior of the plasma chamber 30 and the extraction aperture 35, such as is shown in FIG. 1, may create a bimodal extraction angle profile. In other words, charged ions may exit the extraction aperture 35 at either +θ° or −θ°, where θ is determined by the size and position of the blocker 37, the width of extraction aperture 35 and the electric fields proximate the extraction aperture.

A workpiece 90 is disposed proximate and outside the extraction plate 31 of the plasma chamber 30. In some embodiments, the workpiece 90 may be within about 1 cm of the extraction plate 31 in the z-direction, although other distances are also possible. In operation, the antenna 20 is powered using a RF signal from the RF power supply 27 so as to inductively couple energy into the plasma chamber 30. This inductively coupled energy excites the feed gas introduced from a gas storage container 70 via gas inlet 71, thus generating a plasma. While FIG. 1 shows an antenna, other plasma generators may also be used with the present disclosure. For example, a capacitively coupled plasma generator may be used.

The plasma within the plasma chamber 30 may be biased at the voltage being applied to the chamber walls 32 by the extraction power supply 80. The workpiece 90, which may be disposed on a platen 95, is disposed proximate the extraction plate 31. The platen 95 may be electrically biased by a bias power supply 98. The difference in potential between the plasma and the workpiece 90 causes charged ions in the plasma to be accelerated through the extraction aperture 35 in the form of one or more ribbon ion beams and toward the workpiece 90. In other words, positive ions are attracted toward the workpiece 90 when the voltage applied by the extraction power supply 80 is more positive than the bias voltage applied by the bias power supply 98. Thus, to extract positive ions, the chamber walls 32 may be biased at a positive voltage, while the workpiece is biased at a less positive voltage, ground or a negative voltage. In other embodiments, the chamber walls 32 may be grounded, while the workpiece is biased at a negative voltage. In yet other embodiments, the chamber walls 32 may be biased at a negative voltage, while the workpiece is biased at a more negative voltage.

The ribbon ion beam may be at least as wide as the workpiece 90 in one direction, such as the x-direction, and may be much narrower than the workpiece 90 in the orthogonal direction (or y-direction). In one embodiment, the extracted ribbon ion beam may be about 1 mm in the y-direction and 320 mm in the x-direction.

Further, the platen 95 and workpiece 90 may be translated relative to the extraction aperture 35 such that different portions of the workpiece 90 are exposed to the ribbon ion beam. The process wherein the workpiece 90 is translated so that the workpiece 90 is exposed to the ribbon ion beam 60 is referred to as "a pass". A pass may be performed by translating the platen 95 and workpiece 90 while maintaining the position of the plasma chamber 30. The speed at which the workpiece 90 is translated relative to the extraction aperture 35 may be referred to as workpiece scan velocity. In certain embodiments, the workpiece scan velocity may be about 100 mm/sec, although other speeds may be used. In another embodiment, the plasma chamber 30 may be translated while the workpiece 90 remains stationary. In other embodiments, both the plasma chamber 30 and the workpiece 90 may be translated. In some embodiments, the workpiece 90 moves at a constant workpiece scan velocity relative to the extraction aperture 35 in the y-direction, so that the entirety of the workpiece 90 is exposed to the ribbon ion beam for the same amount of time.

Thus, the workpiece processing apparatus 10 offers the ability to tune many processing parameters during any workpiece processing. For example, the species of ions created in the plasma chamber 30 may be varied by changing the feedgas contained within gas storage container 70. The angle of incidence of those ions may be varied by changing the position of the blocker 37. The energy of the ions exiting the extraction aperture 35 may be tuned by varying the voltage difference between the plasma chamber 30 and the platen 95. Finally, the temperature of the process may be controlled externally. For example, the workpiece processing apparatus 10 may be disposed with a chamber, which may be temperature controlled.

While FIG. 1 shows one apparatus that may be used to perform the disclosed methods, it is understood that other apparatus may also be employed. For example, beam-line ion implanters may also be used. Thus, the methods described herein are not limited to any particular apparatus.

Sputtering may be used to remove material from the workpiece. In this disclosure, the term "sputtering" is intended to denote the removal of material caused by the transfer of kinetic energy from an incoming ion to an atom or molecule disposed on the workpiece. The term "sputtering", as used herein, does not include any chemical interaction between the workpiece and the incoming ions. For this reason, the species used throughout this disclosure are inert gasses, such as helium, neon, argon, krypton, and xenon. Thus, in the present disclosure, the removal of material is controlled exclusively by the physical interaction between the ions and the workpiece. In this way, repeatability may be improved, as chemical interactions, which may be less repeatable due to variation in process chamber conditions such as chamber wall coatings and partial pressure of water or oxygen, are not occurring.

Advantageously, it has been found that, when using sputtering to etch a surface having multiple materials, the sputter yields can be specifically tailored to the goals of the process. For example, the surface of the workpiece may be etched non-selectively, wherein all materials disposed on the workpiece are sputtered at the same rate. Alternatively, the surface of the workpiece may be etched selectively, wherein one material is sputtered at a higher rate than the other materials. This may be done for a plurality of reasons. For example, this may be done to correct a pre-existing discrepancy in height between the materials to planarize the surface. This may also be done to create a desired recess or projection on the surface of the workpiece.

Further, sputter rate selectivity is a function of a number of different processing parameters, many of which can be varied independently. These processing parameters include the species of ions, the energy of those ions, the angle of incidence of the ions and the temperature of the sputtering process. As described above, the workpiece processing apparatus 10 shown in FIG. 1 allows tuning of all of these processing parameters.

Figure 2A:
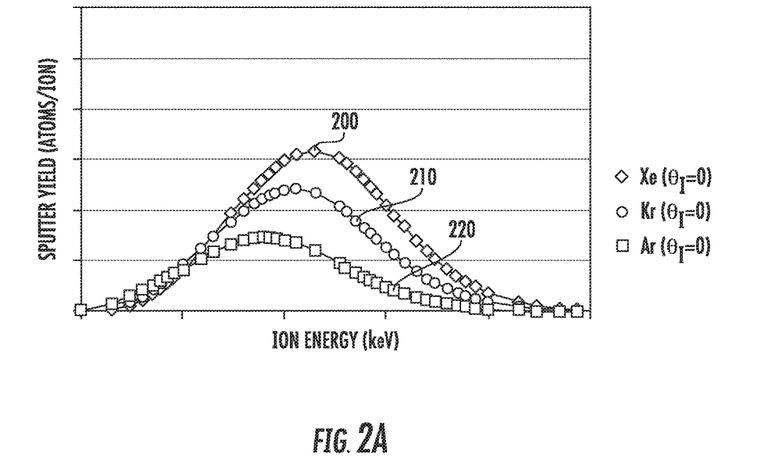
FIG. 2A shows the theoretical relationship between sputter yield, ion energy and ion species for carbon.
Figure 2B:
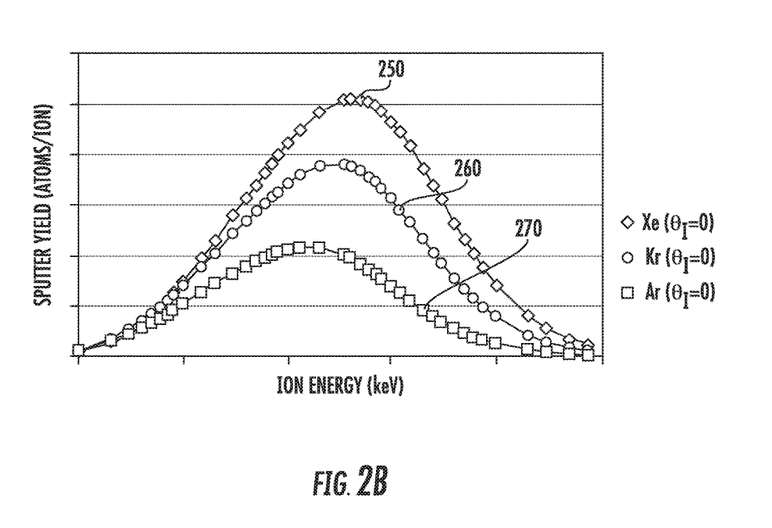
FIG. 2B shows the theoretical relationship between sputter yield, ion energy and ion species for silicon.

FIGS. 2A-2B illustrate the dependence of sputter yield, as measured in atoms per ion, on ion energy and ion species for two different materials. The scales for FIGS. 2A-2B are the same. FIG. 2A shows the theoretical sputter yield for carbon. All ions are directed toward the workpiece at an incidence angle of 0°. Line 200 shows theسputter yield when xenon ions are directed toward a carbon workpiece. The sputter yield resembles a bell curve. Line 210 shows the sputter yield when krypton ions are directed toward a carbon workpiece. Note that the sputter yield is slightly lower for krypton, as compared to xenon. Further, the maximum sputter yield occurs at an energy slightly lower than the energy at which the maximum sputter yield occurs for xenon. Finally, line 220 shows the sputter yield when argon ions are directed toward a carbon workpiece. Note that the sputter yield is slightly lower for argon, as compared to krypton and xenon. Further, the maximum sputter yield occurs at an energy slightly lower than the energy at which the maximum sputter yield occurs for krypton. Thus, the choice of ion species and ion energy helps determine the sputter yield, where each processing parameter has an effect on that yield.

FIG. 2B shows the theoretical sputter yield for silicon. Line 250 shows the sputter yield when xenon ions are directed toward a silicon workpiece. The sputter yield resembles a bell curve. Note that, when compared with line 200, line 250 has a greater maximum sputter yield and the energy at which this maximum sputter yield occurs is greater than it is for carbon. Line 260 shows the sputter yield when krypton ions are directed toward a silicon workpiece. Note that the sputter yield is slightly lower for krypton, as compared to xenon. However, this sputter yield is greater than the maximum sputter yield that can be achieved for carbon when xenon is used as the sputtering species. Further, the maximum sputter yield occurs at an energy slightly lower than the energy at which the maximum sputter yield occurs for xenon. Finally, line 270 shows the sputter yield when argon ions are directed toward a silicon workpiece. Note that the sputter yield is slightly lower for argon, as compared to krypton and xenon. Further, the maximum sputter yield occurs at an energy slightly lower than the energy at which the maximum sputter yield occurs for krypton.

These figures demonstrate that each material has a unique sputter yield relationship with respect to ion species and ion energy.

Figure 3A:
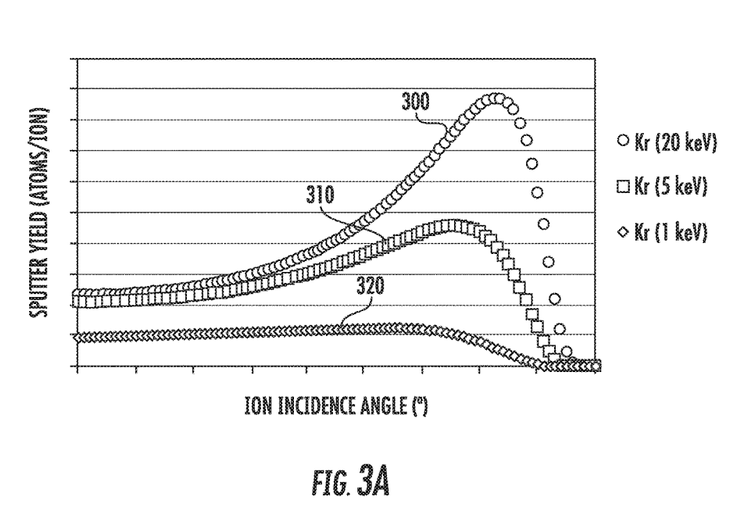
FIG. 3A shows the theoretical relationship between sputter yield, ion energy and angle of incidence for carbon.
Figure 3B:
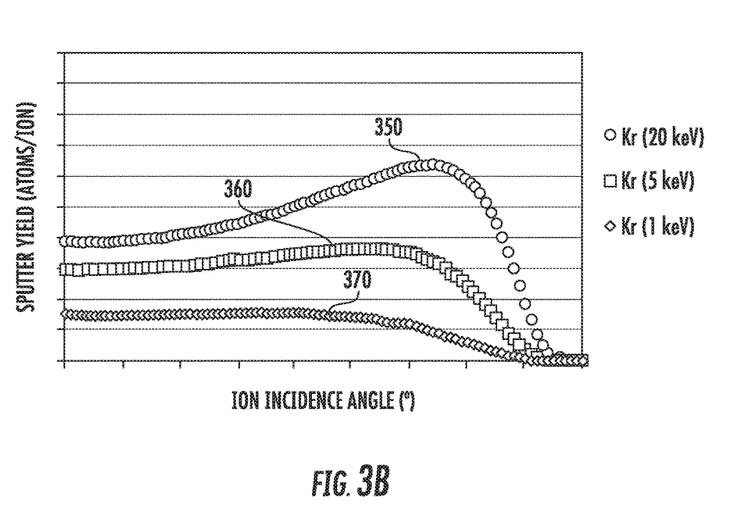
FIG. 3B shows the theoretical relationship between sputter yield, ion energy and angle of incidence for silicon.

FIGS. 3A-3B illustrate the dependence of sputter yield, as measured in atoms per ion, on ion energy and incidence angle for two different materials. The scales for these figures is the same. Throughout this disclosure, incidence angle is measured as the angle between the path of the ions and a line perpendicular to the plane parallel to the surface of the workpiece. Thus, ions travelling in a path that is perpendicular to the workpiece have an angle of incidence of 0°. Ions that are travelling in a path parallel to the workpiece have an incidence angle of 90°.

FIG. 3A shows the theoretical sputter yield for carbon. Line 300 shows the sputter yield when krypton ions are directed toward a carbon workpiece at an energy of 20 keV. The sputter yield increases monotonically until the maximum yield is achieved. Angles greater than this value result in a steep decline in sputter yield. Line 310 shows the sputter yield when krypton ions are directed toward a carbon workpiece at an energy of about 5 keV. Note that the sputter yield is roughly equal to that shown in line 300, for some range of incidence angles. Increasing incidence angles result in increased sputter yield, however, less than that achieved by the 20 keV sputter. Further, the maximum sputter yield occurs at a slightly lower angle than was seen in line 300. Lastly, the decrease in sputter yield at angles greater than this maximum value is more gradual than that shown in line 300. Finally, line 320 shows the sputter yield when krypton ions are directed toward a carbon workpiece at an energy of 1 keV. Note that the sputter yield is relatively constant for a wide range of incidence angles, and experiences a gradual decrease at greater angles.

FIG. 3B shows the sputter yield for silicon. Line 350 shows the sputter yield when krypton ions are directed toward a silicon workpiece at an energy of 20 keV. The sputter yield increases monotonically until the maximum yield is achieved. Angles greater than this value result in a steep decline in sputter yield. Line 360 shows the sputter yield when krypton ions are directed toward a silicon workpiece at an energy of about 5 keV. Note that, unlike carbon, the sputter yield is always less than that shown in line 350. Further, the maximum sputter yield occurs at a slightly lower angle than was seen in line 350. Lastly, the decrease in sputter yield at angles greater than this maximum value is more gradual than that shown in line 350. Finally, line 370 shows the sputter yield when krypton ions are directed toward a silicon workpiece at an energy of 1 keV. Note that the sputter yield is relatively constant for a wide range of incidence angles and experiences a gradual decrease at greater angles.

These figures demonstrate that each material has a unique sputter yield relationship with respect to incidence angle and ion energy.

Figure 4:
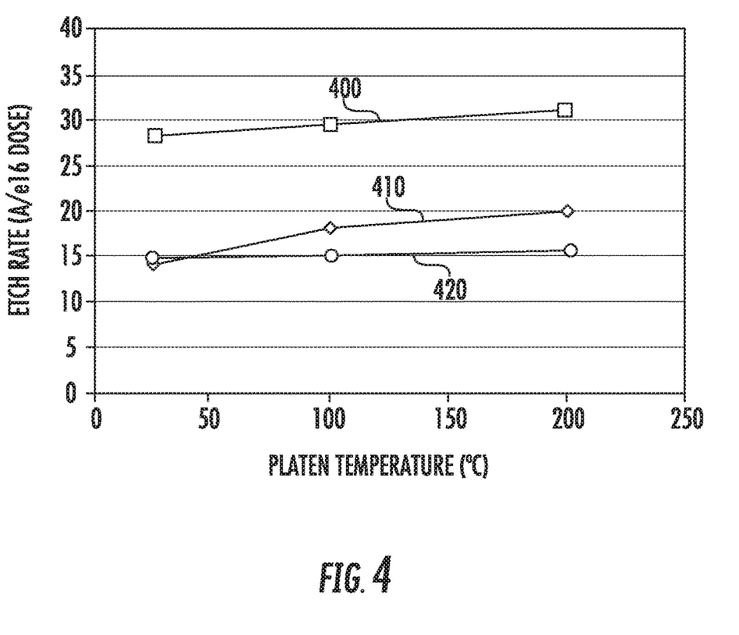
FIG. 4 shows an experimentally-demonstrated relationship between etch rate and platen temperature for three different materials.

FIG. 4 shows the experimentally demonstrated dependence of etch rate, as measured in angstroms per 1e16 ions/cm² ion dose (A/1e16), on platen temperature for three different materials. This graph was created using krypton ions having an energy of 0.8 keV and an incidence angle of 0°. Line 400 shows the etch rate for tungsten, line 410 shows the etch rate for silicon dioxide and line 420 shows the etch rate for silicon nitride. From room temperature to 200° C., the etch rate for tungsten increased about 25%. In contrast, the etch rate for silicon dioxide increased 36%. The etch rate for silicon nitride remains almost constant over the entire temperature range.

These figures demonstrate that each material has a unique etch rate with respect to temperature.

FIGS. 2A-2B, 3A-3B and 4 show that each material has a particular relationship between etch rate and ion species, ion energy, incidence angle and temperature. FIGS. 2A-2B and 3A-3B show the theoretical relationship between certain processing parameters and etch rate. Consequently, the vertical axis is sputter yield, as measured in atoms/ion. In contrast, FIG. 4 is generated based on empirical data and thus the vertical axis is actual etch rate measured in angstroms/1e16 dose. However, those graphs all show that dependence of etch rate on various processing parameters. Further, these graphs show that each material has a unique dependence on these processing parameters.

By understanding the etch rate as a function of these various processing parameters, it is possible to tailor a sputtering process that etches two different materials with a desired etch rate selectivity. Etch rate selectivity is defined as the ratio of the etch rate of a first material to the etch rate of a second material on the workpiece.

Figure 5A:
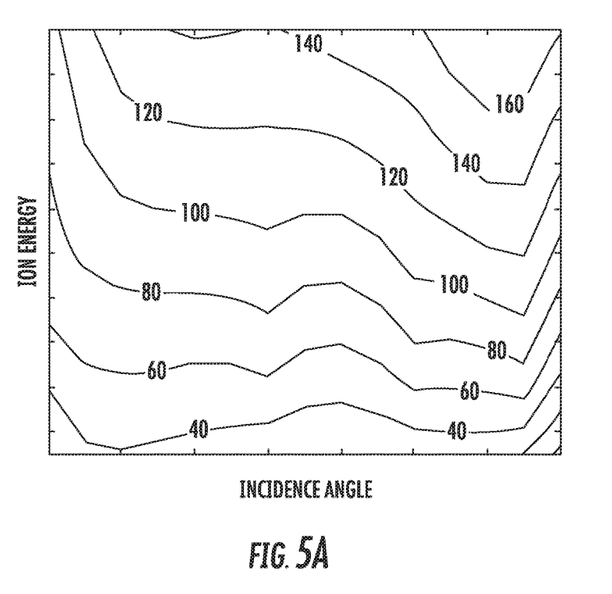
FIGS. 5A-5B show an experimentally demonstrated relationship between etch rate, ion energy and incidence angle for tungsten and silicon, respectively.
Figure 5B:
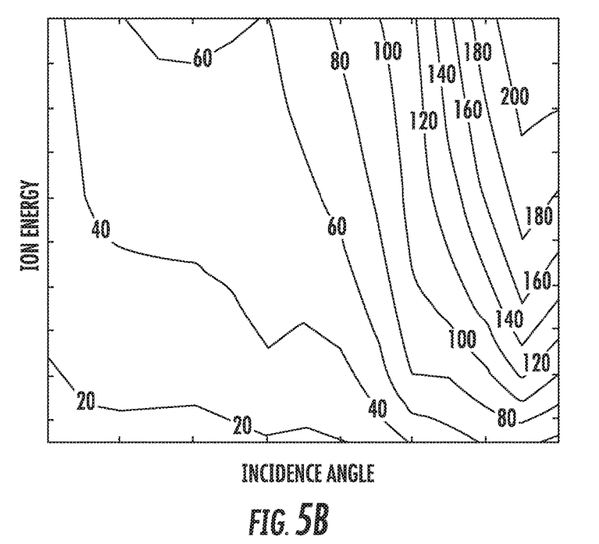

FIGS. 5A-5B show the experimentally demonstrated relationship between etch rate, ion energy and incidence angle for tungsten and silicon, respectively. In these graphs, the vertical axis represents the ion energy, the horizontal axis represents the incidence angle, and the axes have the same scales on both graphs. These graphs were created using krypton as the ion species at room temperature. The energy and incidence angle of the ions were varied to create the graphs. The values indicated on the lines of these figures represents the actual etch rate, as measured in angstroms/1e16 dose.

FIG. 5A shows that the etch rate of tungsten increases as the ion energy increases. There is also an increase in etch rate as the incidence angle increases, although this dependence is far less than the dependence on ion energy. In other words, the change in etch rate is more dramatic in the vertical direction than in the horizontal direction. FIG. 5B shows that the etch rate of silicon increases as incidence angle increases. There is also an increase in etch rate as the ion energy increases, although this dependence is far less than the dependence on incidence angle. In other words, unlike tungsten, the change in etch rate is more dramatic in the horizontal direction than in the vertical direction.

To understand the etch rate selectivity of krypton on tungsten and silicon, the data in FIG. 5A may be divided by the data in FIG. 5B. In other words, by dividing the tungsten etch rate by the silicon etch rate, a dimensionless parameter can be calculated, where this value is the ratio of the etch rate of tungsten to the etch rate of silicon. Thus, this parameter represents tungsten etch selectivity. Values of this parameter that are greater than one indicate that, at this ion energy and incidence angle, more tungsten will be etched than silicon. Values that are less than one indicate that, at this ion energy and incidence angle, more silicon will be etched than tungsten. A value of one indicates that an equal amount of each material will be etched.

Figure 5C:
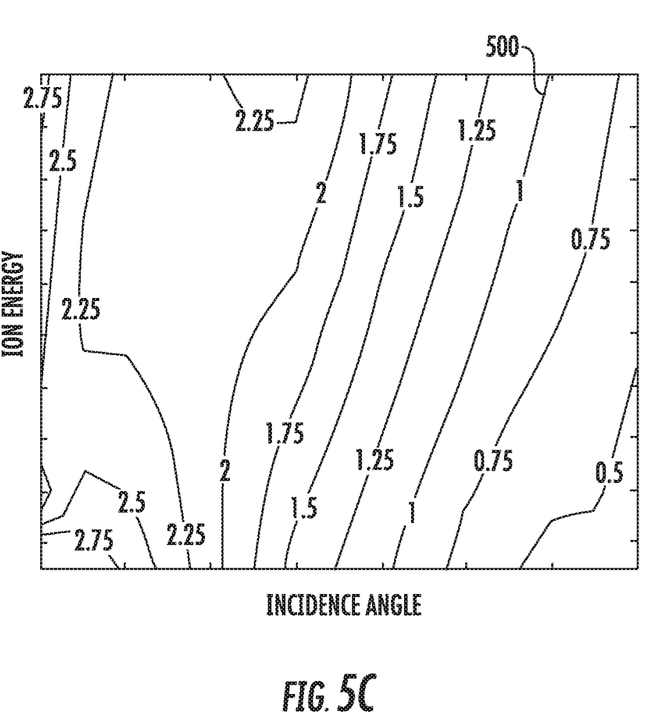
FIG. 5C is the result of dividing the data in FIG. 5A by the data in FIG. 5B, and represents the experimentally demonstrated etch selectivity of tungsten to silicon.

FIG. 5C shows the results when the data of FIG. 5A is divided by the data of FIG. 5B. The values shown on the lines represent the tungsten etch selectivity. Note that for all combinations of ion energy and incidence angle to the left of line 500, tungsten is preferentially etched. For combinations of ion energy and incidence angle to the right of line 500, silicon is preferentially etched. Combinations of ion energy and incidence angle that fall on line 500 result in non-selective etching.

To test this, several workpieces comprising tungsten and silicon were manufactured. A first workpiece was etched using a krypton sputtering process using an ion energy of 0.8 keV and an incidence angle of 0°. The workpiece was measured after the etching process using xSEM data to determine that 56 nm of tungsten was removed, while only 13 nm of silicon was removed. In other words, 4.3 times as much tungsten was etched as silicon. A second workpiece was etched using a krypton sputtering process using an ion energy of 3.0 keV and an incidence angle of 45°. The workpiece was measured using xSEM data to determine that 35 nm of tungsten was removed, and 35 nm of silicon was removed. This combination of ion energy and incidence angle resulted in non-selective etching. In other words, the two materials were etched at the same rate. Finally, a third workpiece was processed using a krypton sputtering process using an ion energy of 0.8 keV and an incidence angle of 66°. The workpiece was measured using xSEM data to determine that 28 nm of tungsten was removed, while 98 nm of silicon was removed. In other words, 3.5 times as much silicon was etched as tungsten. Thus, by varying the ion energy and incidence angle, tungsten etch selectivity can be varied from about 4.3:1 to about 1:3.5. Similar results may be achieved by varying ion species and temperature, as shown in the earlier figures.

In summary, the selectivity of etch rate for two materials can be varied by adjusting one or more of the following processing parameters: ion species, ion energy, ion incidence angle and temperature. A selective etch can be performed by adhering to the following sequence, shown in FIG. 6. First, as shown in Process 600, the two materials to be etched are identified. In many cases, these materials are predetermined by the fabrication process or the device being fabricated. For example, in certain embodiments, one material may be a metal, such as tungsten, while the other is silicon. In other embodiments, one may be an oxide, such as silicon oxide. Once the materials are identified, the etch rate dependence of the first of these materials on one or more of ion species, ion energy, incidence angle and temperature is determined, as shown in Process 610. For example, a graph, similar to that shown in FIG. 5A, may be created which shows the etch rate of the first material as a function of ion energy and incidence angle. Alternatively, a two variable graph using different processing parameters may be created. In other embodiments, three or more processing parameters may be varied to create the etch rate dependence. The etch rate dependence of the second material on at least one of ion species, ion energy, incidence angle and temperature is also created, as shown in Process 620. The processing parameters varied in Process 610 and Process 620 are the same.

Figure 6:
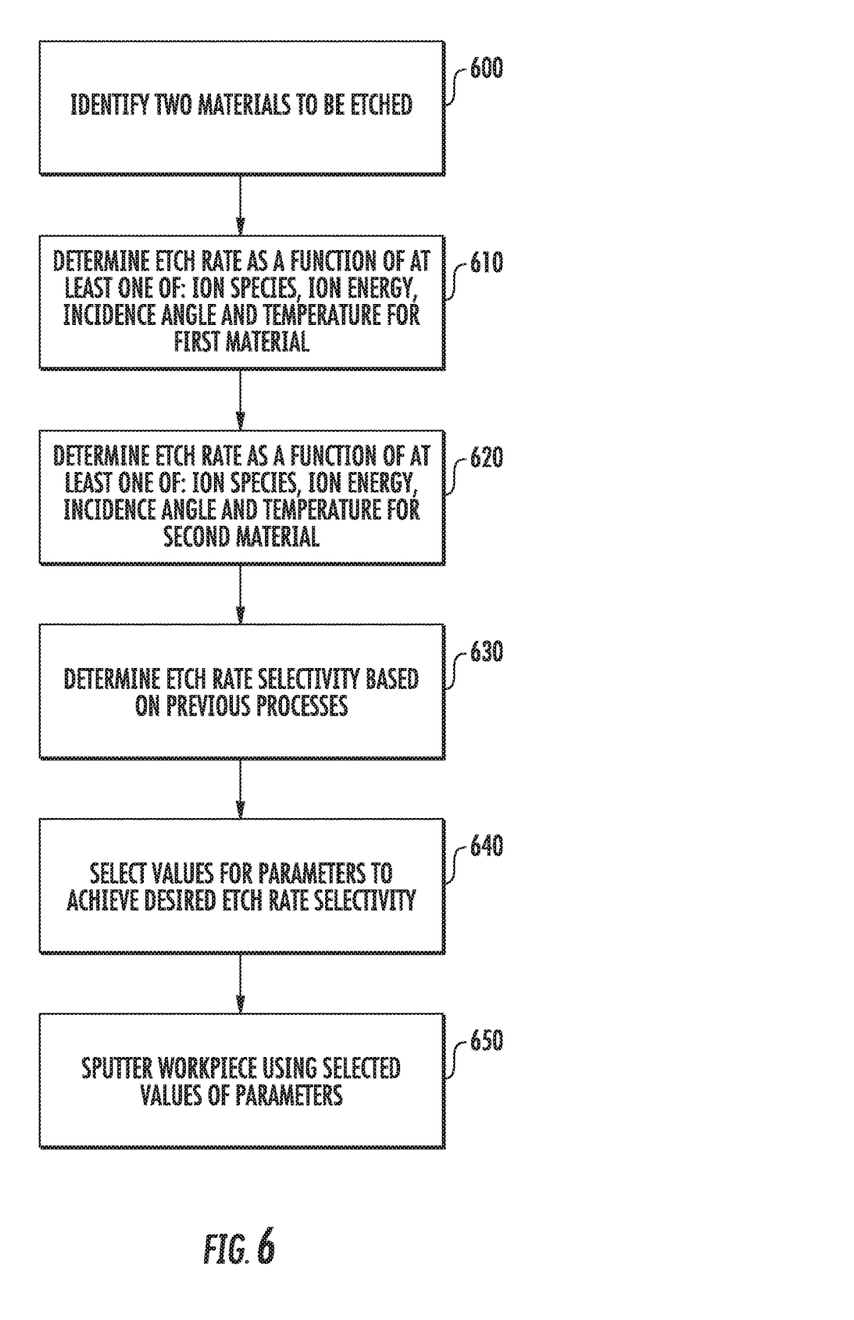
FIG. 6 shows a representative process for etching a workpiece to achieve a desired etch rate selectivity.

The data created in Process 610 is then divided by the data created in Process 620 to determine the etch rate selectivity as a function of one or more of these processing parameters, as shown in Process 630. This may result in a graph, such as that shown in FIG. 5C. Of course, the actual representation of the etch rate selectivity is not limited to this embodiment. For example, a multi-dimensional matrix may also be created.

Once the etch rate selectivity of the two materials has been determined, a set of values for the various processing parameters may be selected to achieve the desired selectivity, as shown in Process 640. For example, as described above, if it is desired to preferentially etch tungsten, a set of values for the processing parameters that results in a high tungsten etch rate selectivity may be used. Alternatively, if the etch rates are desired to be equal, a different set of values may be selected. This set of values may fall on line 500 of FIG. 5C, for example.

Finally, as shown in Process 650, the workpiece is sputtered using the selected values of the various processing parameters.

In another embodiment, it may also be possible to select one or more of the materials disposed on the workpiece. For example, in certain embodiments, a workpiece having a metal and a dielectric material may be fabricated. However, it may be possible to select one of a plurality of dielectric materials. Thus, in this embodiment, the choice of material used on the workpiece becomes another processing parameter that can be varied. For example, if a dielectric material is to be used, an oxide or a nitride may be used. The etch rate dependence of each of these materials on ion species, ion energy, incidence angle and temperature may lead to a determination that one of these dielectric materials is a better choice for a particular application.

Figure 7A:
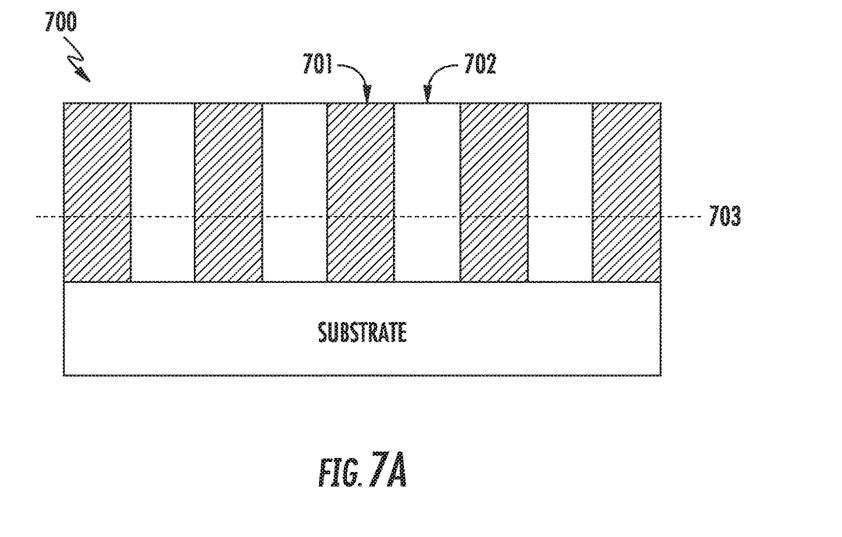
FIGS. 7A-7B illustrate the use of the selective etching process in accordance with one embodiment.

The use of this selective etching process has many applications. For example, in a first embodiment shown in FIG. 7A, the workpiece 700 may comprise two different materials: first material 701 and second material 702. In certain embodiments, first material 701 may be a metal, such as tungsten, while the second material 702 may be silicon or silicon dioxide. In other embodiments, the first material 701 and the second material 702 may each be dielectric materials, such as silicon nitride and silicon dioxide. Of course, the first material 701 and second material 702 are not limited to those listed above. Rather, this list simply illustrates representative materials that may be processed in accordance with this disclosure. The workpiece 700 may be planar prior to any processing. Further the resulting workpiece, after processing, may be desired to be planar. In this example, the workpiece is desired to be etched to line 703. In this case, an etch rate selectivity of 1:1 may be preferred. The etch rate selectivity is defined as the ratio of the etch rate of first material 701 to the etch rate of second material 702. In a variation of FIG. 7A, it may be desired that after processing, first material 701 protrudes to a greater extent than second material 702. In this case, an etch rate selectivity of less than 1:1 may be used. In another variation of FIG. 7A, it may be desired that after processing, second material 702 protrudes to a greater extent than first material 701. In this case, an etch rate selectivity of greater than 1:1 may be used. In some embodiments, this desired non-planarity maybe due to the desire to proactively compensate for a known non-planarity of a subsequent process. In other embodiments, it may be advantageous to allow one of the materials to protrude to a greater extent than the other material. FIG. 7A shows how the etch rate selectivity may be used to create three distinct patterns after a planar workpiece is processed.

Figure 7B:
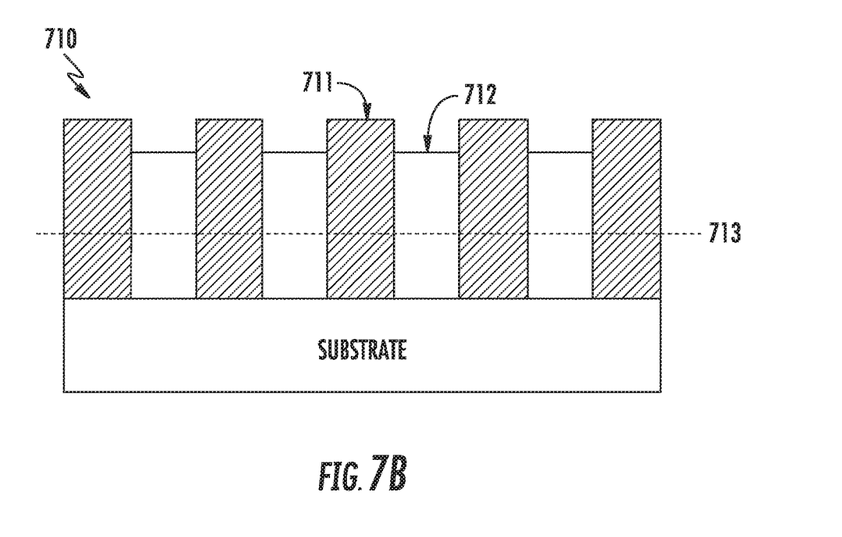

In other embodiments, the workpiece, prior to processing, may not be planar. For example, a CMP process may result in a workpiece 710 where the first material 711 protrudes to a greater extent than second material 712, as shown in FIG. 7B. In certain embodiments, first material 711 may be a metal, such as tungsten, while the second material 712 may be silicon or silicon dioxide. In other embodiments, the first material 711 and the second material 712 may both be dielectric materials, such as silicon nitride and silicon dioxide. Of course, the first material 711 and the second material 712 are not limited to those listed above. Rather, this list simply illustrates representative materials that may be processed in accordance with this disclosure. In some embodiments, the resulting workpiece, after processing, may be desired to be planar. In this example, the workpiece is desired to be etched to line 713. To achieve this, first material 711 is etched to a greater extent than second material 712. Specifically, the ratio of the etch rate of first material 711 to the etch rate of second material 712 may be equal to the ratio of the distance between the top of first material 711 and line 713 and the distance between the top of second material 712 and line 713. Thus, in this case, an etch rate selectivity of greater than 1:1 may be used to achieve a planar workpiece. The etch rate selectivity is defined as the ratio of the etch rate of first material 711 to the etch rate of second material 712.

In another embodiment, the maximum etch rate selectivity is determined. This value then determines the amount of each material that is to be etch in order to achieve a planar surface. For example, assume that first material 711 protrudes 50 nm more than second material 712, and the maximum etch rate selectivity is 3:1. In this scenario, to achieve a planar surface, 25 nm of second material 712 is etched while 75 nm of first material 711 is etched. Thus, line 713 may be determined by the maximum etch rate selectivity.

Of course, in other embodiments, it may be desired that the surface of the workpiece 710, post processing, is not planar. This may be achieved by changing the etch rate selectivity, as described above. Thus, FIG. 7B shows how the etch rate selectivity may be used to correct for non-planarity of previous processes.

Figure 8A:
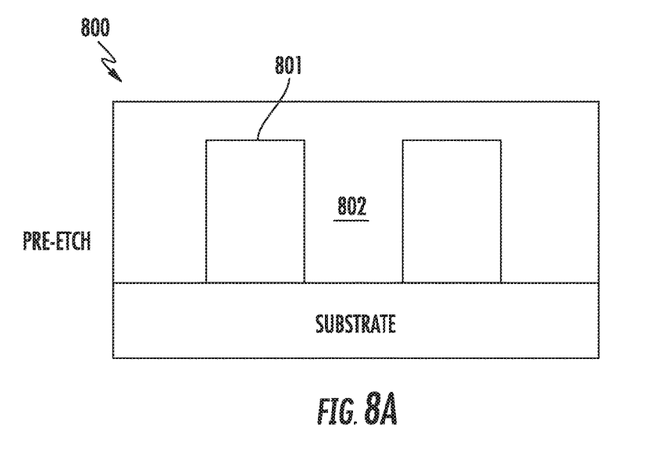
FIGS. 8A-8C illustrate the use of the selective etching process in accordance with another embodiment.
Figure 8B:
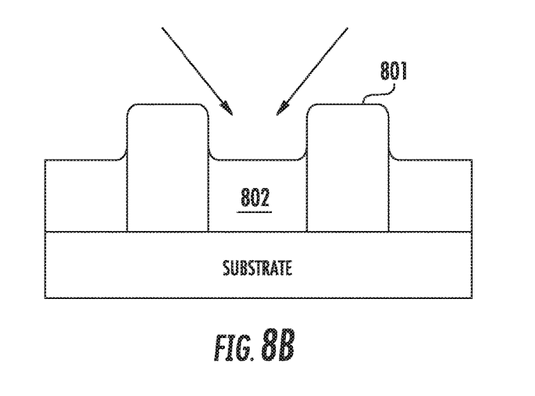
Figure 8C:
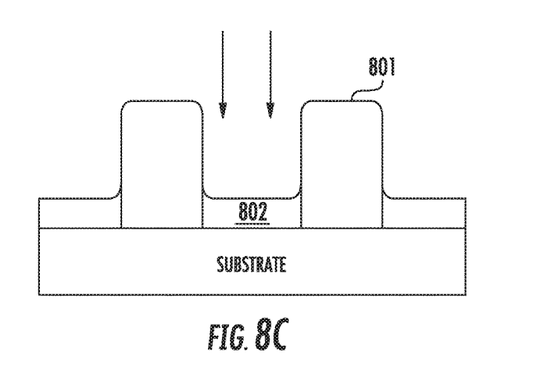

Further, the incidence angle of the ions may be used to further shape the surface of the workpiece. For example, the graphs show that the incidence angle affects the etch rate. However, by maintaining the desired incidence angle and changing the orientation of the workpiece, different shapes may be created. FIG. 8A shows a workpiece 800 prior to etching. In this embodiment, it may be desirable to preferentially etch the second material 802. Assume that first material 801 is applied in parallel strips that extend into the plane of the page. In one particular example, first material 801 may be tungsten, while second material 802 is silicon. However, other materials may be employed. If the ions are directed toward the workpiece 800 perpendicular to the major dimension of the strips of first material 801, as shown in FIG. 8B, the second material 802 may be etched until the first material 801 casts a shadow on second material 802. Thus, second material 802 cannot be etched further than is shown in FIG. 8B. In addition, the edges of the strips of first material 801 may become rounded. If, instead, the ions are directed parallel to the major dimension of the first material 801, as shown in FIG. 8C (i.e. tilted into or out of the page), the first material 801 does not interfere with the etching of second material 802, allowing for more of material second 802 to be removed.

Figure 9A:
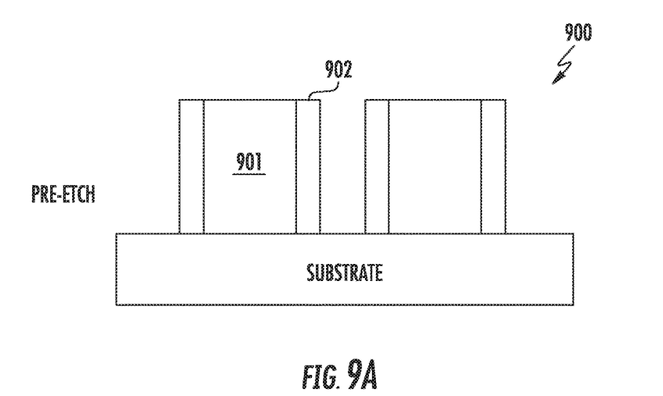
FIGS. 9A-9C illustrate the use of the selective etching process in accordance with another embodiment.
Figure 9B:
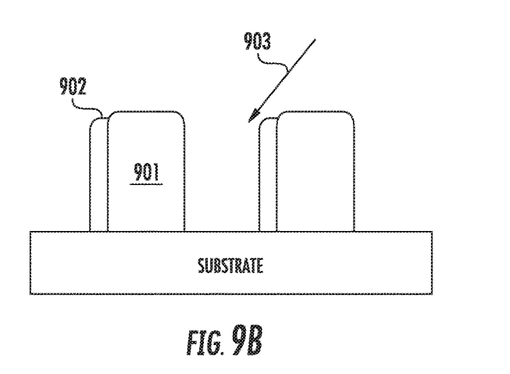
Figure 9C:
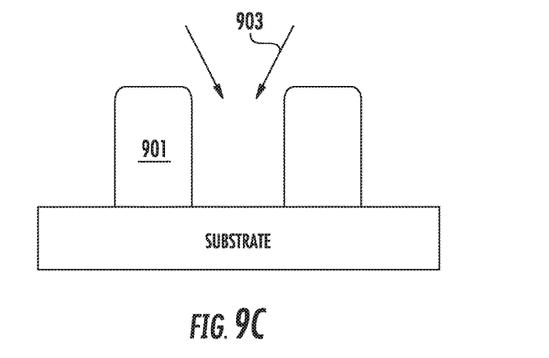

The selective etch process described may also be used to remove material from the sidewall of a structure. For example, as shown in FIG. 9A, a workpiece 900 may have a first material 901 which extends upward from the workpiece. The first material 901 may be in the form of a three-dimensional structure, such as a fin. This first material 901 may have a second material 902 deposited on its sidewalls. For example, first material 901 may be silicon while second material 902 may be titanium nitride. Of course, other materials may also be used. The selective etch process may be used to remove the second material 902 while only minimally affecting first material 901. Second material 902 may be removed from one sidewall by only directing ions 903 at one incidence angle, as shown in FIG. 9B. The second material 902 may be removed from both sidewalls by directing ions 903 using two incidence angles, as shown in FIG. 9C.

Recently, it has been found that selective area processing (SAP) may be used to remove non-planarity and other non-uniformities causes in the semiconductor fabrication process. Advantageously, the selective etching, through the use of physical sputtering, can be used as part of this SAP process. In certain embodiments, the workpiece, after certain processing is completed, may be non-planar. This non-planarity is non-uniform. For example, there may be regions where the height of the workpiece is taller than the rest of the workpiece. For example, the sputtering process may be used to remove more material on certain portions of the workpiece. Thus, the selective etch process described herein may be applied to the entire surface of a workpiece, or only to certain portions of the workpiece.

The embodiments described above in the present application may have many advantages. First, as described above, other methods of planarization have drawbacks such as non-uniformity or non-repeatability. Because the present method is a completely physical sputtering process, these issues are greatly reduced. Further, the present process is applicable on both a macro and micro scale. In other words, CMP is usually tuned to a particular pitch on the workpiece. If there are various pitches, dishing may occur. Secondly, the present method allows the optimization of processing parameters to selectively etch the surface of a workpiece. This selective processing may be used to planarize a surface, correct a non-planarity caused by a previous process, or compensate for a known non-planarity of a subsequent process. Further, the present method can be used to create three-dimensional features by preferentially etching one of the materials.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of selectively etching a workpiece having two materials using a sputtering process, comprising:
   determining a first etch rate of a first material as a function of at least one processing parameter, wherein the at least one processing parameter is selected from the group consisting of ion species, ion energy, incidence angle and temperature;
   determining a second etch rate of a second material as a function of the at least one processing parameter;
   calculating etch rate selectivity of the first material to the second material based on the first etch rate and the second etch rate;
   selecting values of the at least one processing parameter such that the etch rate selectivity matches a desired etch rate selectivity; and physically sputtering the workpiece using the values of the at least one processing parameter, wherein the physical sputtering process is performed using an inert gas and removal of the first material and the second material is achieved exclusively by physical interaction between the inert gas and the workpiece.

2. The method of claim 1, wherein the first etch rate and the second etch rate are determined as a function of at least two processing parameters.

3. The method of claim 2, wherein the two processing parameters comprises ion energy and incidence angle.

4. The method of claim 1, wherein the first etch rate and the second etch rate are determined as a function of at least three processing parameters.

5. The method of claim 1, wherein the first etch rate and the second etch rate are determined as a function of four processing parameters.

6. A method of planarizing a workpiece having a first material and a second material using a physical sputtering process, comprising:
    determining an amount that the first material protrudes beyond the second material;
    selecting a desired etch rate selectivity greater than 1, so as to preferentially etch the first material;
    determining values of processing parameters to achieve the desired etch rate selectivity, where the processing parameters are selected from the group consisting of ion species, ion energy, incidence angle and temperature; and
    performing the physical sputtering process using the values of the processing parameters until a surface of the workpiece is planar, wherein the physical sputtering process is performed using an inert gas and removal of the first material and the second material is achieved exclusively by physical interaction between the inert gas and the workpiece.

7. The method of claim 6, wherein the desired etch rate selectivity is determined by:
    determining a first etch rate of the first material as a function of at least one of the processing parameters;
    determining a second etch rate of the second material as a function of the at least one of the processing parameters;
    calculating a maximum etch rate selectivity based on the first etch rate and the second etch rate; and
    using the maximum etch rate selectivity as the desired etch rate selectivity.

8. The method of claim 6, further comprising:
    selecting a desired depth at which a surface of the workpiece is to be planar;
    measuring a first distance from a top of the first material to the desired depth;
    measuring a second distance from a top of the second material to the desired depth; and
    calculating the desired etch rate selectivity by dividing the first distance by the second distance.

9. The method of claim 6, wherein determining the values of the processing parameters to achieve the desired etch rate selectivity comprises:
    determining a first etch rate of the first material as a function of at least one of the processing parameters;
    determining a second etch rate of the second material as a function of the at least one of the processing parameters;
    calculating an etch rate selectivity of the first material to the second material based on the first etch rate and the second etch rate; and
    selecting the values of the processing parameters such that the etch rate selectivity equals the desired etch rate selectivity.

10. The method of claim 9, wherein the first etch rate and the second etch rate are determined as a function of at least two of the processing parameters.

11. The method of claim 10, wherein the at least two of the processing parameters comprise ion energy and incidence angle.

12. The method of claim 6, wherein one of the processing parameters comprises incidence angle, and the incidence angle is non-zero and the workpiece is oriented relative to incoming ions to achieve a desired etch pattern.

13. The method of claim 6, wherein the method is used as part of a selective area process, to planarize a portion of a surface of a workpiece.

14. A method of processing a workpiece comprising a first material and a second material, comprising:
    physically sputtering the workpiece using ions of an ion species directed toward the workpiece at a predetermined incidence angle and energy, where the ion species, the predetermined incidence angle and energy are selected to achieve a desired etch rate selectivity, where etch rate selectivity is defined as a ratio of an etch rate of the first material to an etch rate of the second material, and the ion species is an inert gas and removal of the first material and the second material is achieved exclusively by physical interaction between the inert gas and the workpiece.

15. The method of claim 14, wherein the first material is a metal.

16. The method of claim 14, wherein the first material forms a three-dimensional structure and the second material is disposed on sidewalls of the three-dimensional structure.

17. The method of claim 16, wherein the etch rate selectivity is less than 1.

18. The method of claim 14, wherein the first material is disposed in parallel strips along a surface of the workpiece and the second material is disposed between the parallel strips, and the ions are directed toward the workpiece at a non-zero incidence angle and the ions are directed in a direction parallel to a major axis of the parallel strips.

19. The method of claim 14, wherein temperature is also selected to achieve the desired etch rate selectivity.

* * * * *